United States Patent [19]

Moitzger

[11] Patent Number: 4,861,251
[45] Date of Patent: Aug. 29, 1989

[54] APPARATUS FOR ENCAPSULATING SELECTED PORTIONS OF A PRINTED CIRCUIT BOARD

[75] Inventor: Max Moitzger, Lodi, Calif.
[73] Assignee: Diehard Engineering, Inc., San Jose, Calif.
[21] Appl. No.: 162,065
[22] Filed: Feb. 29, 1988
[51] Int. Cl.⁴ .............................................. B29C 45/14
[52] U.S. Cl. ..................................... 425/116; 249/96; 249/119; 264/272.15; 264/272.17; 425/127; 425/388; 425/546; 425/556; 425/572; 425/573; 425/588
[58] Field of Search .............. 425/110, 116, 127, 388, 425/546, 572, 573, 588, 556; 249/91, 96, 94, 95, 119; 264/272.15, 272.17, 511

[56] References Cited
U.S. PATENT DOCUMENTS
3,247,550  4/1966  Haines, Jr. ......................... 264/511
4,332,537  6/1982  Slepcevic ........................... 425/572
4,546,951  10/1985  Boschman ......................... 249/95
4,688,152  8/1987  Chia ................................. 361/408

Primary Examiner—Jay H. Woo
Assistant Examiner—Timothy W. Heitbrink
Attorney, Agent, or Firm—Fliesler, Dubb, Meyer & Lovejoy

[57] ABSTRACT

An apparatus for encapsulating selected portions of the printed circuit board in a pin grid array using transfer molding techniques. In one embodiment for encapsulating only the top surface and side edges of the board, a vacuum is provided in the lower cavity to hold the edges of the bottom surface of the board flush against the mold plate. In a second embodiment for encapsulating all exposed surfaces of the board, the array pins are inserted in holes in the bottom of the cavity and supported by an adjustable block which positions the board in the cavity.

19 Claims, 11 Drawing Sheets

APPARATUS FOR ENCAPSULATING SELECTED PORTIONS OF A PRINTED CIRCUIT BOARD

BACKGROUND OF THE INVENTION

1. Field of the Invention

The present invention relates to molding apparatus in general and in particular to a method and apparatus for encapsulating selected portions of the printed circuit board in a pin grid array.

2. Description of the Prior Art

A pin grid array comprises a printed circuit board, a plurality of pin members which extend from the board and a surface on which is mounted an integrated chip or other electronic component. In a typical embodiment, the electronic components of the chip are connected to electrical pads located on the board surrounding the chip by means of tiny wires. The pads are in turn connected to selected pin members by means of the printed circuitry in or on the surface of the board.

To protect the chip, the interconnecting wires and the printed circuit, some sort of protective cover is provided. The protective cover may take the form of a separate cover member which is attached to the edges of the board. However, separate covers are expensive to manufacture and assemble on the array and obtaining reliable airtight seals with the board is a problem.

To avoid some of the problems associated with using separate covers, various molding techniques have been used for hermetically encapsulating selected portions of the board. For example, in one prior known method, as disclosed in U.S. Pat. No. 4,688,152, the board is clamped between the surface of a lower mold plate and an upper mold plate by means of pin members or ribs in the cavity of the upper mold plate. This method produces indentations in the encapsulating material and exposes portions of the board. It also requires that space be provided on the board to receive the pin members.

In certain applications it is necessary to encapsulate only the upper surface and side edges of the board. In other applications it is necessary to encapsulate all exposed surfaces of the board. In all cases, a good and reliable seal between the encapsulating compound and the board is required to prevent the incursion of air and other foreign material from damaging the electronic components and wiring on the board.

The types of molding compounds used and the thickness of the encapsulating walls may also vary depending on the requirements of the application.

SUMMARY OF THE INVENTION

In view of the foregoing, principal objects of the present invention are a method and apparatus for encapsulating selected portions of the printed circuit board in a pin grid array in molding compound comprising transfer molding methods and apparatus.

In one embodiment of the present invention in which only the upper surface and side edges of the board in the array are encapsulated, there is provided a transfer mold comprising an upper and lower cavity mold plate. During the encapsulating process the board in the array is placed over the cavity in the lower mold plate. The edges of the board are supported by the wall surrounding the cavity, and support members in the interior of the cavity support the center of the board. The pin members in the array project downwardly into the cavity. With the board covering the cavity a vacuum is created in the cavity to hold the board down tightly against the surface of the mold surrounding the cavity. The upper mold plate is then placed over the lower mold plate such that the board lies within the walls of the cavity in the upper mold plate. The plates are then held together as by a press and molding compound transferred into the cavity in the upper mold plate until the upper surface and side edges of the board are entirely encapsulated. When the molding compound has cured, the plates are opened and the encapsulated array removed therefrom.

In another embodiment of the present invention in which all exposed surfaces of the board in an array are encapsulated, there is also provided an upper and a lower cavity mold plate. However, in this embodiment, a plurality of pin receiving holes are provided in the bottom wall of the cavity in the lower plate. In the encapsulating process the pins in the array are inserted in the holes in the bottom wall of the cavity and supported by an adjustable block located therebeneath. The upper plate is then laid over the lower plate and molding compound is transferred into the upper and lower cavities. In practice, the adjustable block is used to position the board in the cavities and thereby control the thickness of the molding compound on the upper and lower surfaces of the board.

BRIEF DESCRIPTION OF THE DRAWINGS

The above and other objects, features and advantages of the present invention will become apparent from the following detailed description of the accompanying drawings, in which.

DETAILED DESCRIPTION OF THE DRAWING

Figure 1:
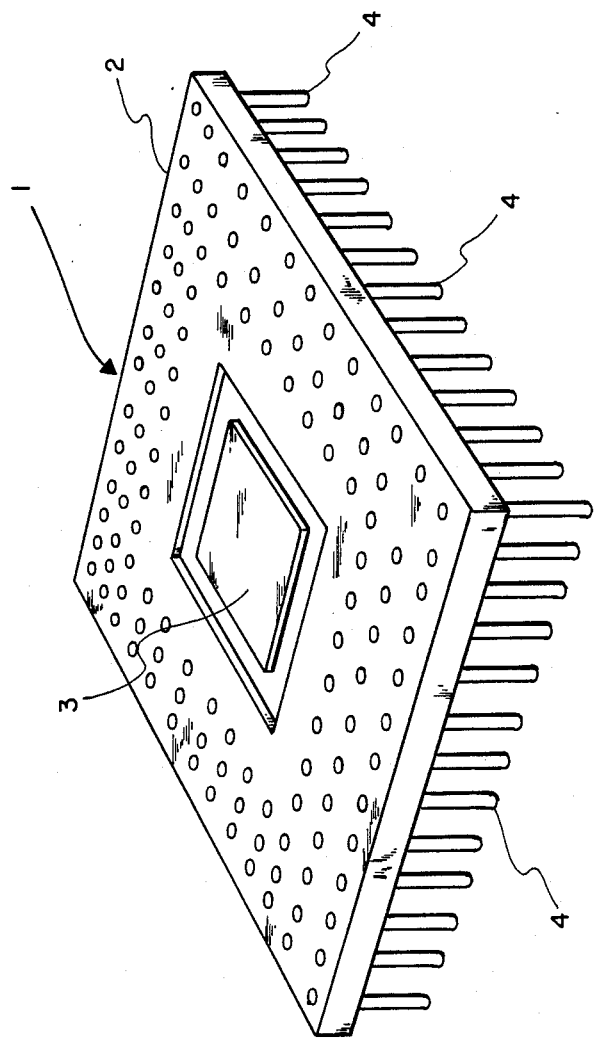
FIG. 1 is a perspective view of a typical pin grid array which is encapsulated using the method and apparatus according to the present invention.

Referring to FIG. 1, there is shown a pin grid array designated generally as 1. In the array 1 there is provided a printed circuit board 2. Centrally located in a space provided therefor on the printed circuit board 2 there is provided an integrated circuit chip 3. Extending from the board 2 there is provided a plurality of pin members 4. In practice, by means not shown, electronic components in the chip 3 are connected to pads on the board 2 surrounding the chip 3 by tiny wires. The pads are, in turn, connected to selected ones of the pins 4 by means of printed circuitry located on the surface of or in the board 2.

Figure 2:
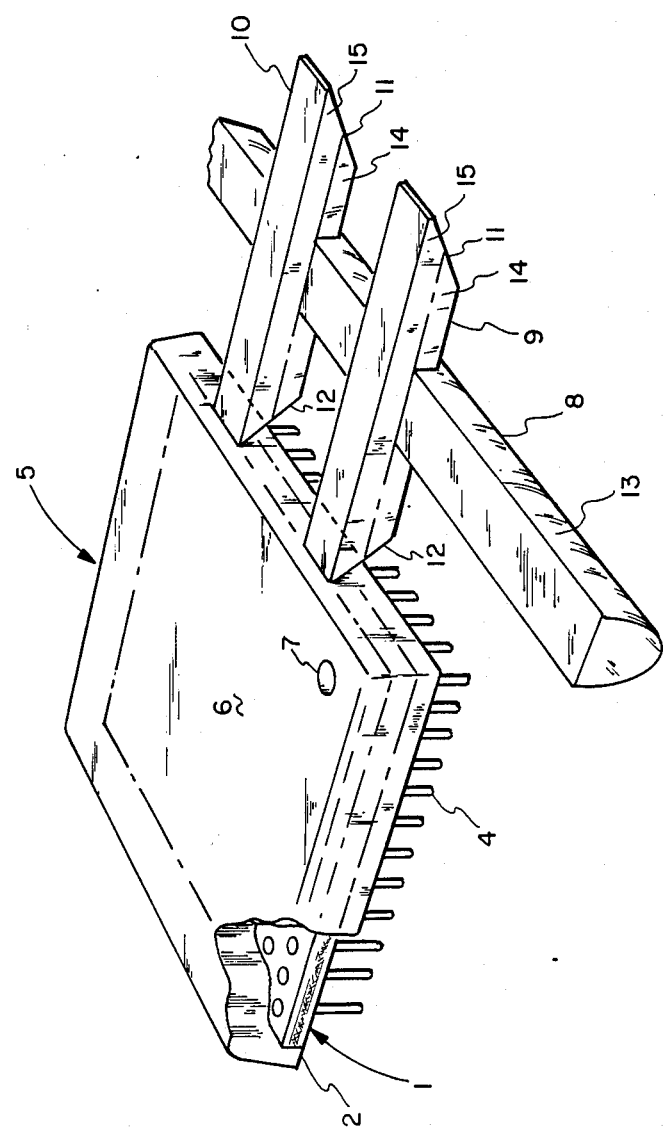
FIG. 2 is a perspective view of an encapsulated pin grid array in accordance with the present invention.

Referring to FIG. 2, there is provided in accordance with the present invention an encapsulated pin grid array designated generally as 5. The array 5 comprises the pin grid array 1 described above with respect to FIG. 1 in which the upper surface and sides of the board 2 are encapsulated in a molding compound designated as 6. In a corner of the array 5 there is provided an indicator 7 which identifies the #1 pin in the array. The indicator 7 may be a bump, a recess or the like. Extending from one side of the array 5 as seen in FIG. 2 there is shown a plurality of runners 8, 9 and 10. Runners 8, 9 and 10 are formed in the process of encapsulating the array 5 and are removed from the array 5 at the end of the encapsulating process.

As will be further described below, the runners 8, 9 and 10 are provided with drafts 11, 12, 13, 14 and 15. Drafts 11 and 12 are provided to reduce the cross-section of the runners at the edge of the array 5. Drafts 13, 14 and 15 are provided to facilitate removal of the runners 8-10 and the array 5 from the molding cavities.

Figure 3:
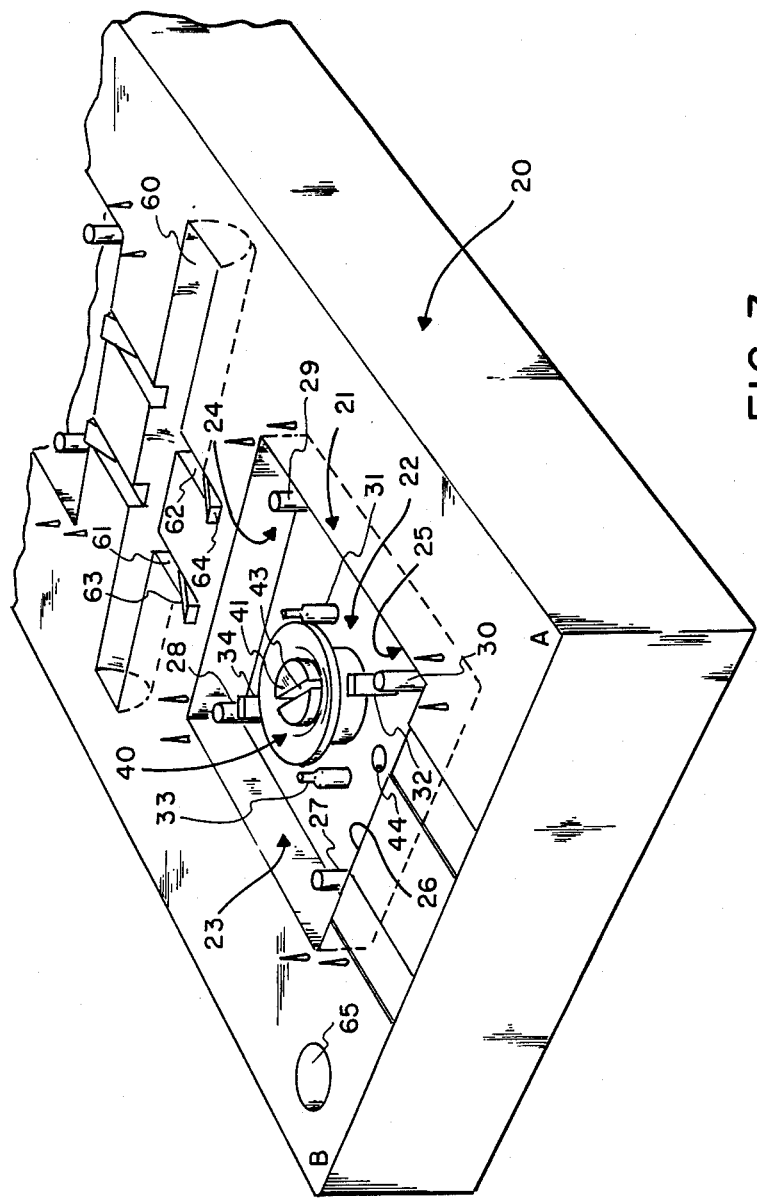
FIG. 3 is a partial perspective view of a lower cavity plate used for encapsulating the array of FIG. 2.
Figure 4:
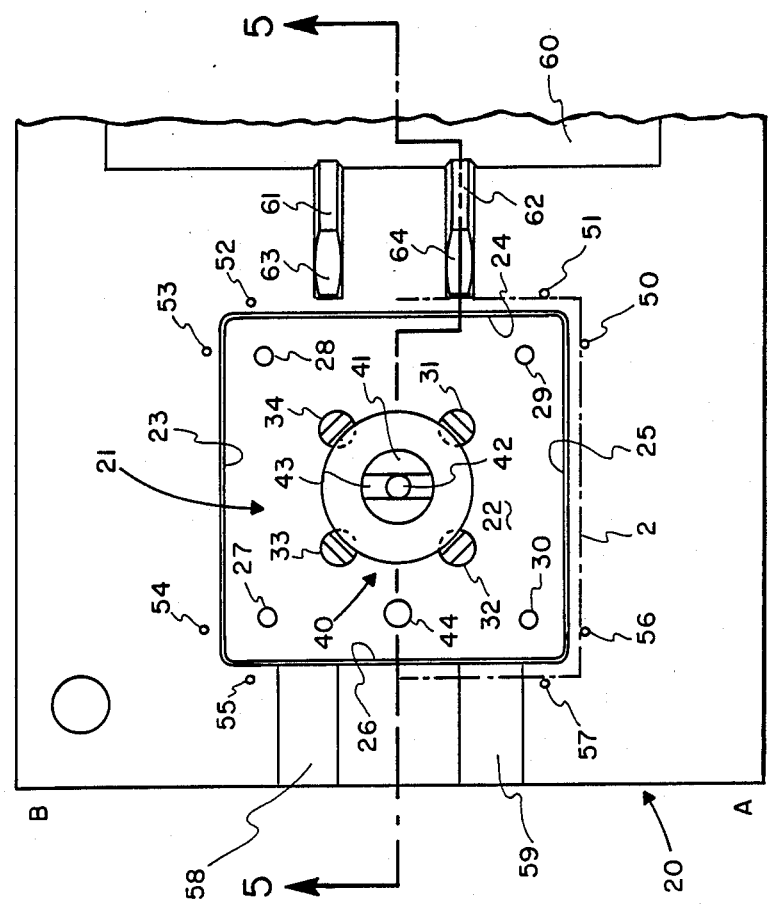
FIG. 4 is a top plan view of the cavity in the lower cavity plate shown in FIG. 3.

Referring to FIGS. 3 and 4, there is provided in accordance with a first embodiment of the present invention a lower cavity mold plate designated generally as 20. Plate 20 comprises a cavity 21 having a bottom wall 22 and a plurality of side walls 23, 24, 25 and 26. Extending from the bottom wall 22 there is provided a plurality of post members 27, 28, 29, 30, 31, 32, 33 and 34. Post members 27-30 are cylindrical members which are positioned in the corners of the cavity 21. Post members 31-34 have a lower cylindrical portion and an upper portion which is rectangular in cross-section. Centrally located between the members 31-34 there is provided a cup-shaped flexible member 40. Member 40, also known as a vacuum cup, is made from a fluorocarbon elastomer such as provided by DuPont and 3M. The reduced cross-section of the members 31-34 provides a clearance for the member 40 when the member 40 is depressed, as will be described below.

Centrally located in the member 40 there is provided a fitting 41. Fitting 41 is provided with an axial bore 42 and a transverse slot 43 which is in communication with the axial bore 42. The slot 43 and the axial bore 42 are coupled to a vacuum passageway 80, as will be further described below with respect to FIG. 6. There is also provided in the bottom wall 22 of the cavity 21 a vacuum passageway 44 which is in communication with the passageway 80.

At the corners of the cavity 21 there is provided a plurality of board locating pins 50, 51, 52, 53, 54, 55, 56 and 57. As shown more clearly in FIG. 4, pins 50-57 are used for centering the board 2 shown in phantom lines relative to the cavity 21.

Extending transverse the plate 20 in the center of the plate 20 there is provided a runner cavity 60. Extending from the runner cavity 60 toward side wall 24 there is provided a pair of runner cavities 61 and 62. Runner cavities 61 and 62 are provided with ramps 63 and 64 which extend above the board 2 for providing the draft 11 described above with respect to FIG. 2 and for directing the molding compound above the board 2 so as to force the periphery of the board 2 against the lower mold plate 20 as the upper cavity described below is filled with molding compound. Extending from the side wall 26 to the edge of the plate 20 there is provided a pair of shallow passageways 58 and 59. Passageways 58 and 59 allow air to escape from the upper cavity described below, as molding compound is transferred into the cavity.

In a corner of the plate 20 there is provided a locator pin receiving hole 65. Hole 65 is provided for receiving a locator pin 66 as shown in FIG. 5.

Figure 5:
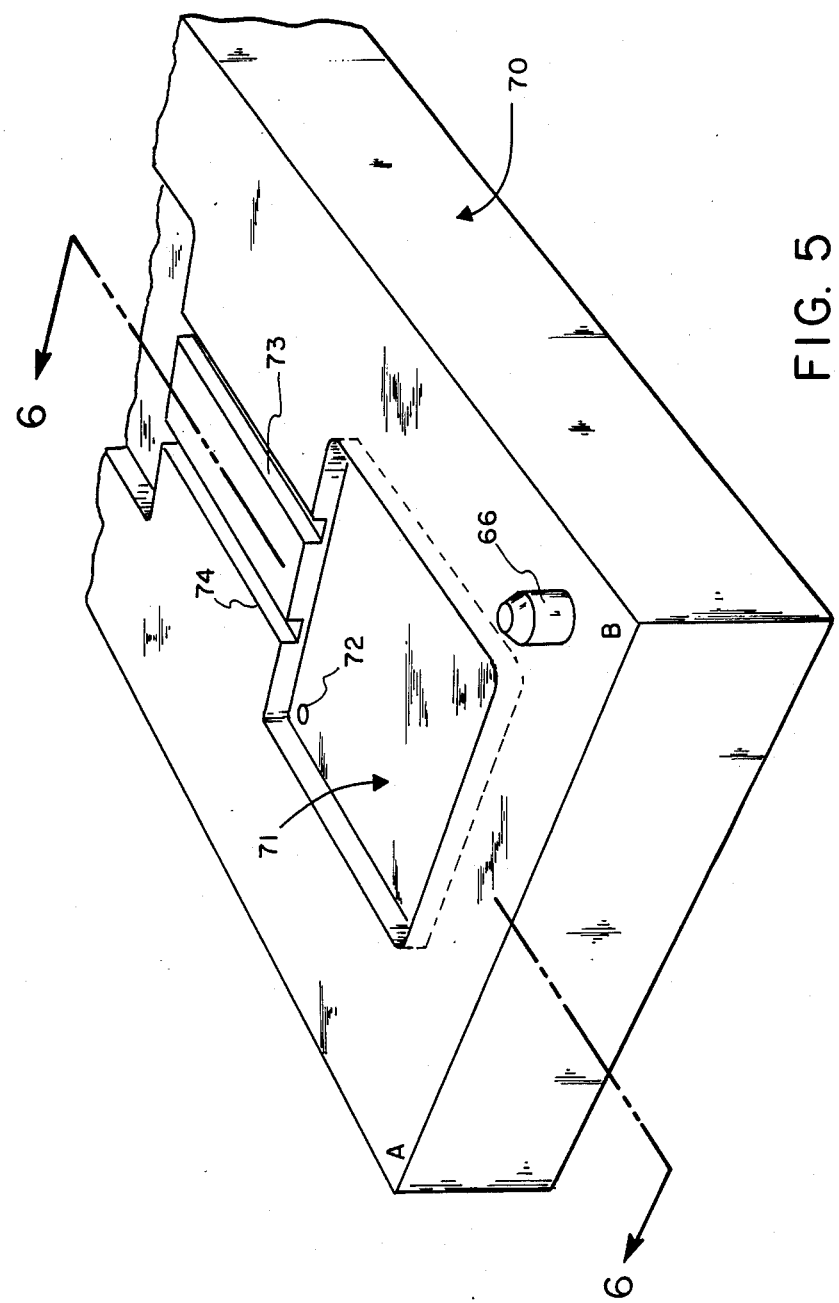
FIG. 5 is a partial perspective view of an upper cavity plate according to the present invention.

Referring to FIG. 5, there is provided in accordance with the present invention an upper cavity plate 70. In the plate 70 there is provided a cavity 71. In a corner of the cavity 71 there is provided a small bump or recess 72 for providing the indicator 7 described above with respect to FIG. 2. Extending into the cavity 71 there is provided a pair of runner cavities 73 and 74. Runner cavities 73 and 74 correspond to runners 61 and 62, respectively, when the plate 70 is placed on the plate 20 as shown in FIG. 6.

Figure 6:
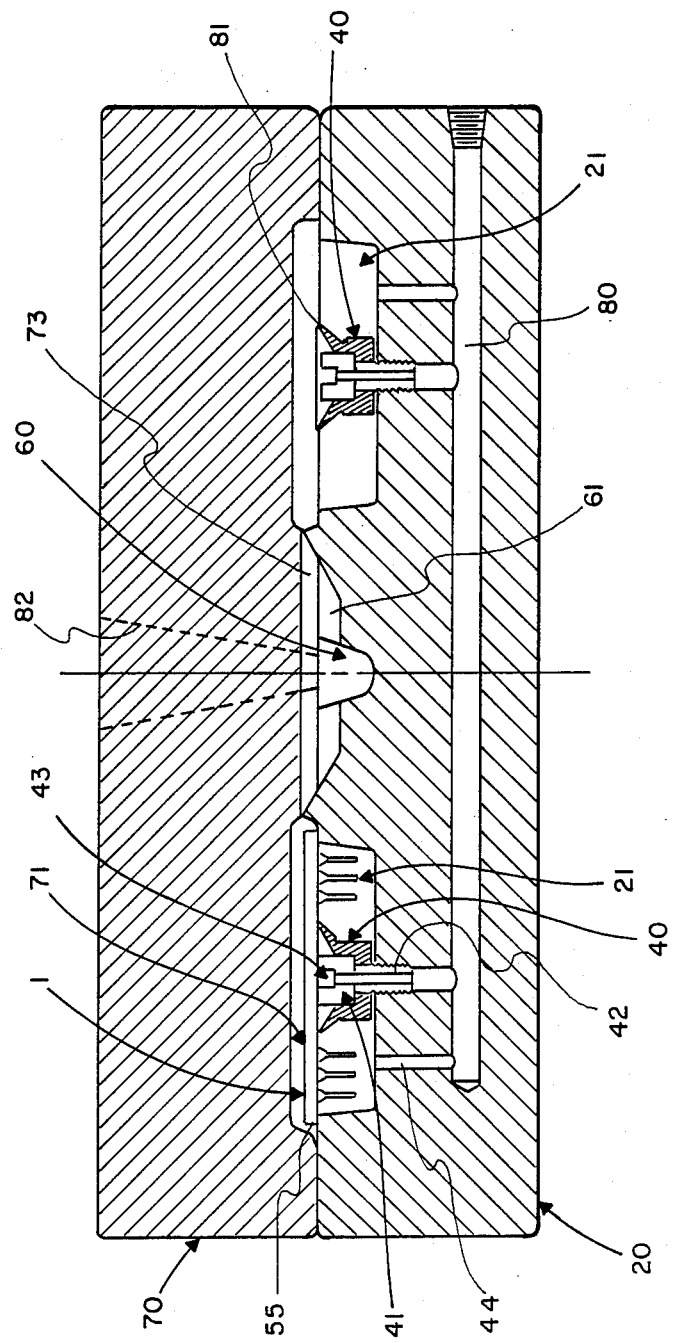
FIG. 6 is a cross-sectional view taken in the direction of lines 5—5 of FIGS. 4 and 5 when the upper and lower cavity plates are placed in facing relationship.

Referring to FIG. 6, the vacuum passageway 80 as provided in the lower plate 20 is connected to passageways 40 and 44 for providing a vacuum in the cavity 21 when the board 1 is placed over the cavity 21.

Referring to the right side of FIG. 6 which shows a second cavity identical to cavity 71, it will be noted that the upper edge 81 of the cup-shaped member 40 is slightly higher than the plane of the upper edge of the cavity 21. When the board 2 of the array 1 is placed over the cavity 21, the upper edge 81 contacts the board 2. As the board 2 is placed on the surface of the plate 20 surrounding the cavity 21, the edge 81 is depressed, forming a vacuum-tight seal with the board 2 when a source of vacuum is coupled to the passageway 80.

In use, transfer molding compound is transferred into the cavity 60 through an inclined bore 82 in the plate 70. From the cavity 60 the molding compound is transferred through the runners 61 and 73 and through the runners 62 and 74 to the cavity 71. In the cavity 71, the molding compound encapsulates the upper surface and side edges of the board 2. After the molding compound is cured, the plates 20 and 70 are separated and the array 5 removed therefrom.

Figures 7, 8:
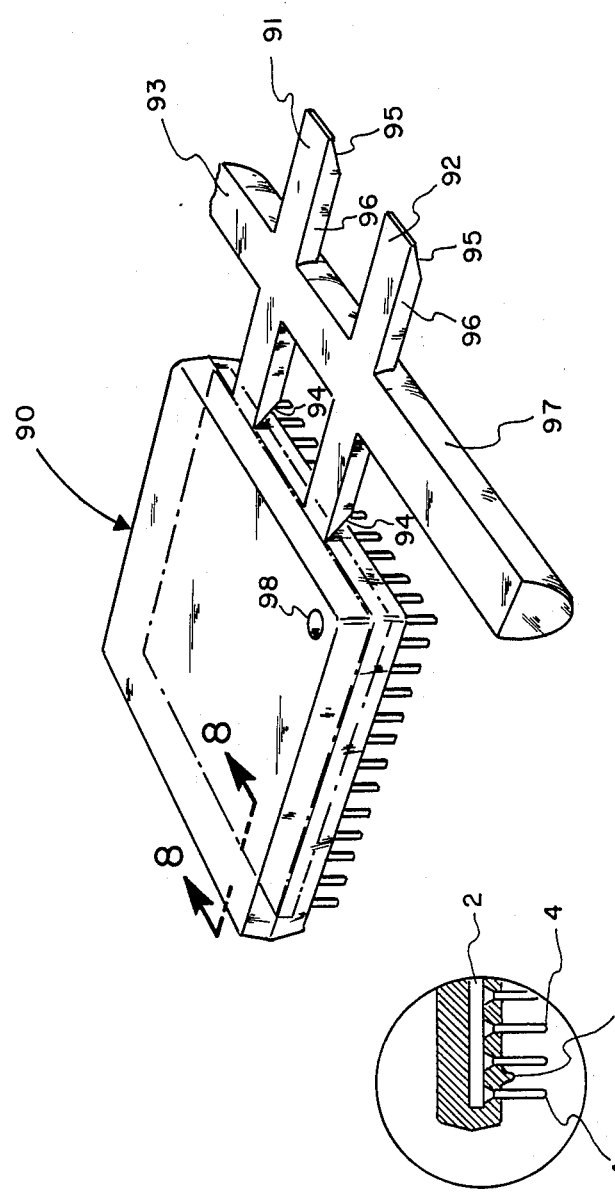
FIG. 7 is a perspective view of an encapsulated pin grid array according to another embodiment of the present invention.
FIG. 8 is an enlarged partial cross-sectional view taken in the direction of lines 8—8 in FIG. 7.

Referring to FIG. 7, there is provided in another embodiment of the present invention an encapsulated pin grid array designated generally as 90. Extending from the array 90 there is provided a plurality of runners 91, 92 and 93. Each of the runners 91 and 92 have a plurality of drafts 94, 95 and 96. Runner 93 has a draft 97. Drafts 94, 95 reduce the cross-section of the runners at the edge of the array 90 and together with drafts 96 and 97 facilitate removal of the runners and the array 90 from the mold plates, as will be further described below.

At the corner of the array 90 there is provided either a recess or a bump or other indicator 98. The indicator 98 is provided for indicating the #1 pin in the array.

Referring to FIG. 8, the array 90 comprises the printed circuit board 2 and the array of pins 4 described above with respect to FIG. 1. Extending downwardly from the encapsulated board 2, there is provided a bump 100. Bump 100 is provided for controlling the depth to which the pin array 90 is inserted in pin receiving holes in a device not shown. A plurality of the bumps 100 are provided at selected locations on the device 90 for this purpose.

Figure 9:
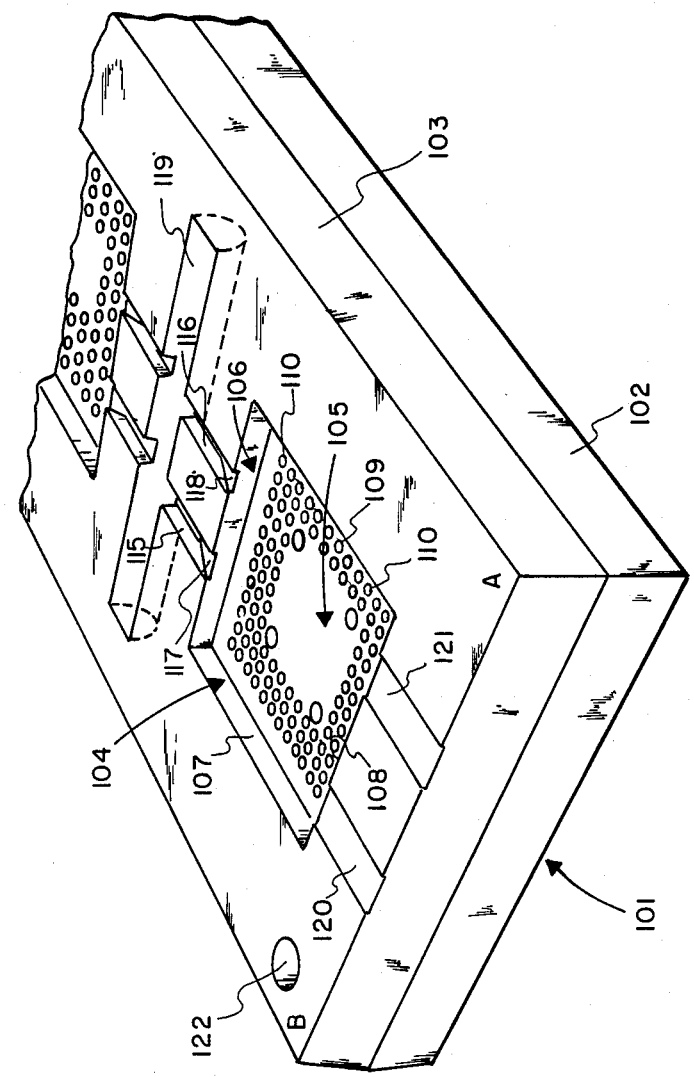
FIG. 9 is a partial perspective view of a lower cavity plate used for encapsulating the pin grid array of FIG. 7.
Figure 10:
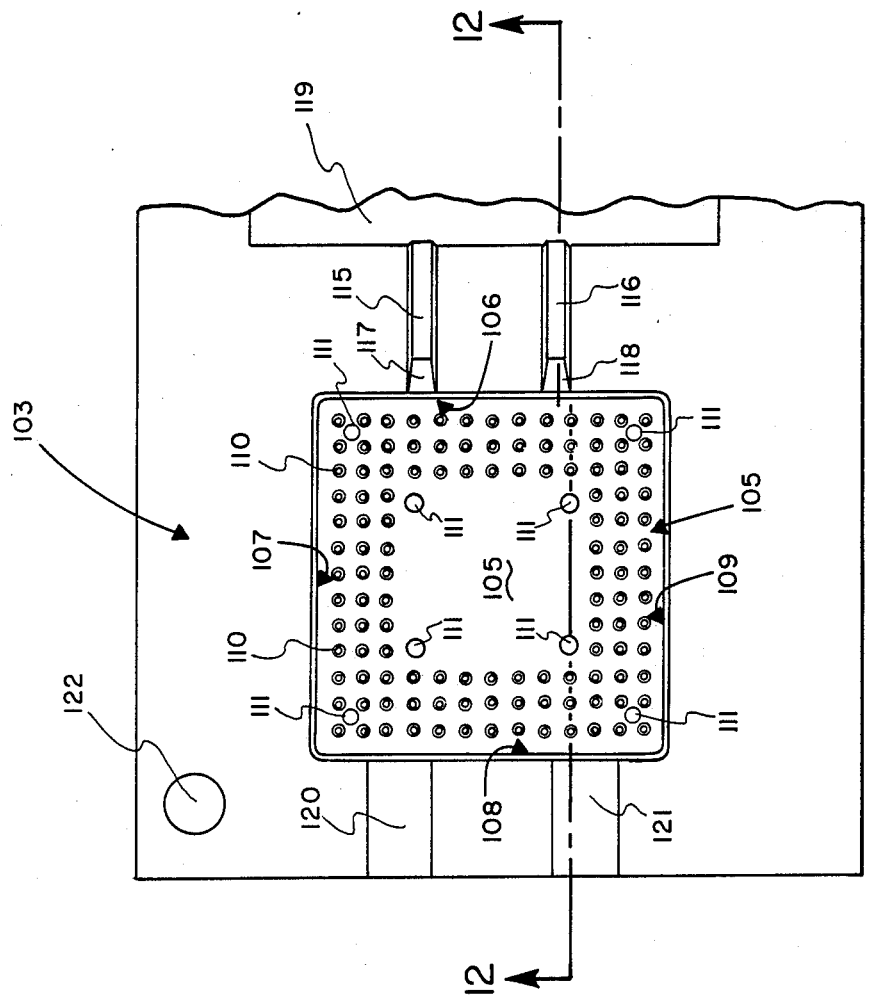
FIG. 10 is a top plan view of the lower plate of FIG. 9.

Referring to FIGS. 9 and 10, there is provided a lower cavity mold plate designated generally as 101 comprising a plurality of plate members 102 and 103. A cavity 104 is located in the upper surface of the plate 103. Cavity 104 comprises a bottom wall 105 and a plurality of side walls 106, 107, 18 and 109. In the bottom wall 105 there is provided a plurality of pin receiving holes 110. The holes 110 are provided for receiving the pins 4 extending from the board 2. At selected locations in the bottom wall 105 there is provided a plurality of ejector pin holes 111. Extending from the wall 106 there is provided a pair of passageways 115 and 116. In passageways 115 and 116 there are provided a pair of ramps 117 and 118, respectively, for providing the drafts 94 described above with respect to FIG. 7. The opposite end of the passageways 115 and 116 are provided to be in communication with a passageway 119. Extending from the wall 108 to the edge of the plate member 103 there is provided a pair of shallow passageways 120 and 121. In a corner of the plate 103 there is provided a pin locating hole 122.

Figure 11:
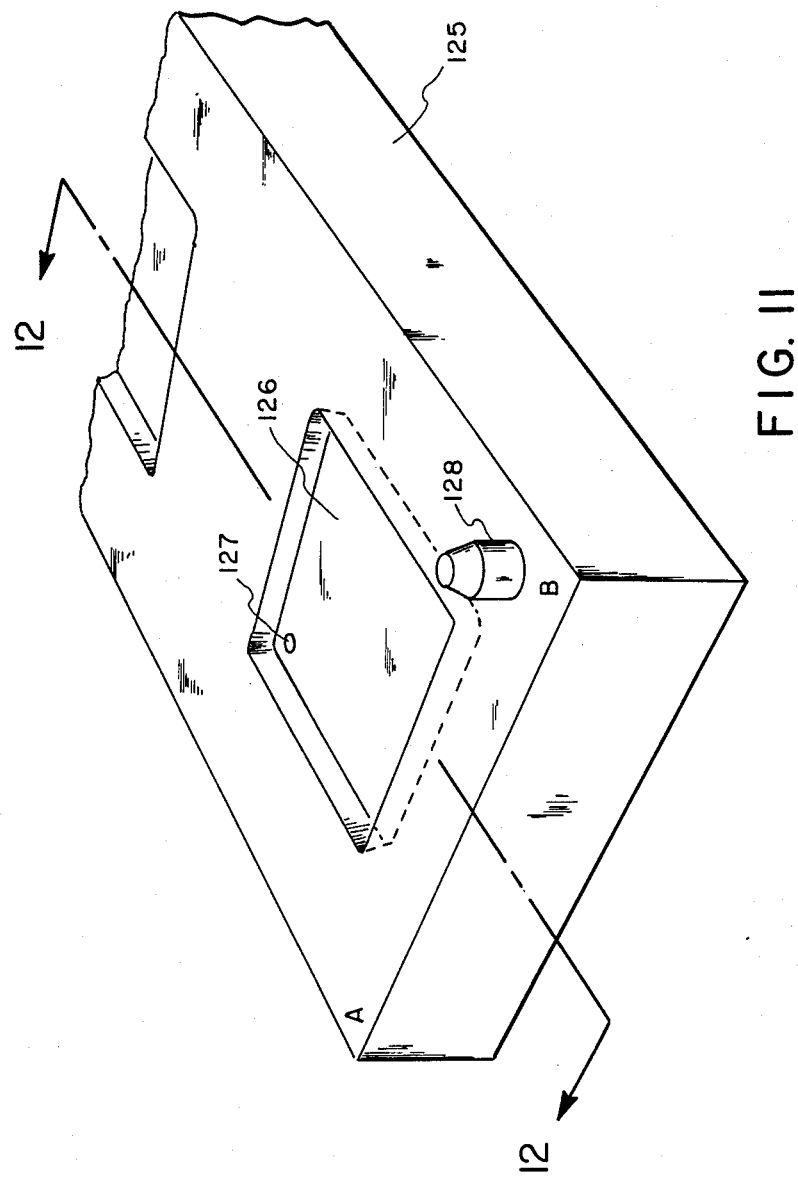
FIG. 11 is a partial perspective view of an upper cavity plate used for encapsulating the pin grid array of FIG. 7.

Referring to FIG. 11, there is provided an upper cavity plate 125. In the plate 125 there is provided a cavity 126. In the bottom wall of the cavity 126 there is provided a recess or bump 127 for providing the indicator 98 described above with respect to FIG. 7. In a corner of the plate 125 there is provided a locator pin 128 which is inserted in the pin receiving hole 122 when the plates 125 and 101 are placed in a facing relationship as shown in FIG. 12.

Figure 12:
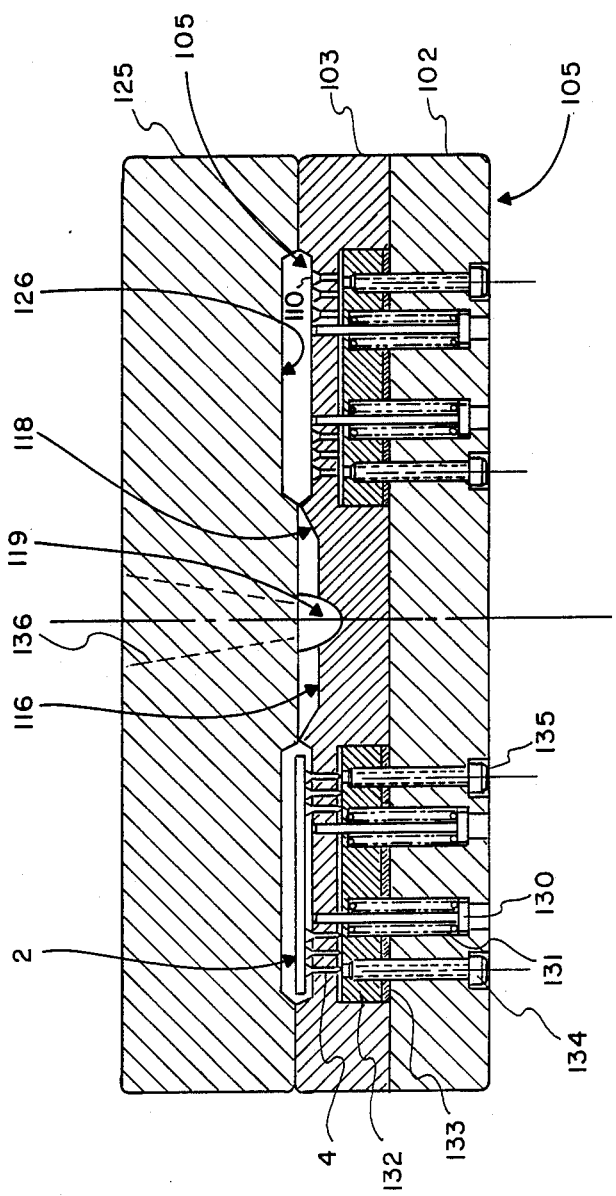
FIG. 12 is a cross-sectional view taken along the lines 11—11 in FIGS. 10 and 11.

Referring to FIG. 12, there is provided in each of the ejector pin holes 111 a spring-biased ejector pin 130 and an ejector spring 131.

Located in a hole provided therefor below the pin receiving holes 110 there is provided a pin supporting block 132 and a shimming plate 133. The block 132 is provided for supporting the pin members 4 which, in turn, positions the board 2 within the cavities 105 and 126. To raise the board 2 the supporting block 132 is raised by inserting a thicker shimming member 133 therebeneath. Conversely, to lower the board 2 in the cavities 105 and 126, the block 132 is supported on a thinner shimming member 133. The block 132 and shimming member 133 are held in the lower plate member 102 by means of a pair of bolts 134 and 135. Raising and lowering the board 2 controls the thickness of the molding compound.

In the upper plate 125 there is also provided a conically shaped passageway 136 which communicates with the passageway 119.

In use, after the pins 4 are fitted in the pin receiving holes 110 in the cavity 105 and the upper plate 125 is placed on the lower plate 101, the plates are placed in a press and transfer molding compound is transferred into the cavities 105 and 126 through the passageways 136, 119, 115 and 116. The molding compound in the cavities 105 and 126 surrounds the board 2, entirely encapsulating the board in the molding compound. After the molding compound is cured, the plates 101 and 125 are separated and the ejector pins 130 are activated to remove the array 90 from the cavity 105.

While a preferred embodiment of the present invention is described above, it is contemplated that various modifications may be made thereto without departing from the spirit and scope of the present invention. For example, the above description of two embodiments of the pin grid array cavity molds was limited to a detailed description of a single cavity in each mold plate. However, typically two or more sets of cavities are provided in each mold plate for maximum production at minimum cost. Details of the cavities, e.g. their shape and size, may also be changed to accommodate specific pin grid arrays, as can the size and placement of the runner passageways and the positioning of the array in the cavities 105 and 126. Accordingly, it is intended that the embodiments described be considered only as illustrations of the present invention and that the scope thereof should not be limited thereto but be determined by reference to the claims hereinafter provided.

What is claimed is:

1. An apparatus for encapsulating selected portions of a pin grid array in molding compound, said array comprising a printed circuit board and a plurality of pins which extend from said board, comprising:
   a first mold plate having a planar surface;
   a second mold plate having a planar surface;
   a first cavity in said planar surface of said first mold plate for receiving said pins, said first cavity having a bottom wall and a plurality of side walls and dimensions such that the outside edges of said board extend beyond said cavity so that a predetermined portion of the periphery of said board rests on said planar surface of said first mold plate;
   a plurality of supporting members which extend from said bottom wall of said first cavity for supporting said array at selected points within the periphery of said board;
   means located in at least one of said mold plates for positioning said array relative to said first cavity;
   vacuum means for holding said predetermined portion of the periphery of said board tightly against said planar surface of said first mold plate;
   a second cavity in said second mold plate which extends beyond the periphery of said first cavity and said board when said first and said second cavities are placed in a facing relationship with said array located therein; and
   means for transferring molding compound into said second cavity to encapsulate said selected portions of said pin grid array with said molding compound.

2. An apparatus according to claim 1 wherein said vacuum means comprises means for providing a vacuum within the interior of said first cavity when said board covers said cavity.

3. An apparatus according to claim 2 wherein said vacuum providing means comprises:
   a flexible cup-shaped member adapted to form a vacuum-tight seal with the undersurface of said board, said cup-shaped member having a vacuum passageway centrally located therein; and
   means for coupling said vacuum passageway to a source of vacuum.

4. An apparatus according to claim 1 wherein said positioning means comprises a plurality of pin members which are located in said planar surface of said first mold plate at predetermined positions relative to said first cavity for engaging each side of said board.

5. An apparatus according to claim 1 wherein said means for transferring said molding compound comprises a first passageway for transferring said molding compound into said second cavity and a second passageway for allowing air to escape from said second cavity as said molding compound is transferred into said second cavity.

6. An apparatus according to claim 5 wherein said first passageway for transferring said molding compound into said second cavity comprises means for reducing the cross-section of a runner formed by said molding compound at the edge of said second cavity, and means for directing molding compound above said board so as to force the periphery of the board against said first mold plate as said second cavity in said mold plate is filled with said molding compound.

7. An apparatus according to claim 6 wherein said cross-section reducing means and said molding compound directing means comprises an inclined surface for forming a ramp in said first passageway which extends above said board.

8. An apparatus for encapsulating selected portions of a pin grid array in molding compound, said array comprising a printed circuit board, and a plurality of pins which extend from a surface of said board, comprising:
- a first mold plate;
- a second mold plate;
- a first cavity in said first mold plate, said first cavity having a bottom wall, a plurality of side walls, a horizontal cross-section such that said board can fit within said side walls and a plurality of holes which extend through said bottom wall for receiving said plurality of pins which extend from said board;
- means for supporting said board at a predetermined distance from said bottom wall in said first cavity;
- a second cavity in said second mold plate, said second cavity having a horizontal cross-section which is substantially equal to said horizontal cross-section of said first cavity; and
- means for transferring molding compound into said first and said second cavities.

9. An apparatus according to claim 8 comprising ejecting means for removing said pin grid array from said first cavity after said selected portions of said array are encapsulated in said molding compound.

10. An apparatus according to claim 9 wherein said ejecting means comprises a plurality of ejector pins which are movably mounted in holes provided therefor in said bottom wall of said first cavity.

11. An apparatus according to claim 10 comprising means for resiliently biasing said ejector pins to a retracted position such that the free ends of said pins are substantially in the plane of said bottom wall of said first cavity when said pins are in their retracted position.

12. An apparatus according to claim 8 wherein said supporting means comprises:
- means located in a second cavity provided therefor in said first mold plate below said pin receiving holes in said bottom wall of said first cavity for supporting said pins which extend from said board through said holes.

13. An apparatus according to claim 12 wherein said pin supporting means in said second cavity comprises means for adjusting the position of said pin supporting means in said second cavity so as to adjust the position of said board relative to said bottom wall in said first cavity.

14. An apparatus according to claim 13 wherein said pin supporting means comprises a block having a planar surface for engaging said pins and said adjusting means comprises means for adjusting the position of said block in said second cavity in said first mold plate.

15. An apparatus according to claim 14 wherein said adjusting means comprises a shimming member for shimming said block.

16. An apparatus according to claim 14 wherein said adjusting means comprises an adjusting screw.

17. An apparatus for encapsulating selected portions of a pin grid array in molding compound, said array comprising a printed circuit board and a plurality of pins which extend from said board, comprising:
- a first mold plate having a planar surface;
- a second mold plate having a planar surface;
- a first cavity in said planar surface of said first mold plate for receiving said pins, said cavity having a bottom wall and a plurality of side walls and dimensions such that the outside edges of said board extend beyond said cavity so that a predetermined portion of the periphery of said board rests on said planar surface of said first mold plate;
- a plurality of supporting members which extend from said bottom wall of said first cavity for supporting said array at selected points within the periphery of said board;
- means located in at least one of said mold plates for positioning said array relative to said first cavity;
- vacuum means for holding said predetermined portion of the periphery of said board tightly against said planar surface of said first mold plate, said vacuum means including means for providing a vacuum within the interior of said first cavity when said board covers said cavity, a flexible cup-shaped member adapted to form a vacuum-tight seal with the undersurface of said board, said cup-shaped member having a vacuum passageway centrally located therein, and means for coupling said vacuum passageway to a source of vacuum;
- a second cavity in said second mold plate which extends beyond the periphery of said first cavity and said board when said first and said second cavities are placed in a facing relationship with said array located therein; and
- means for transferring molding compound into said second cavity to encapsulate said selected portions of said pin grid array with said molding compound.

18. An apparatus according to claim 17 wherein said vacuum passageway comprises a first vacuum passageway and comprising a fitting centrally located within the interior of said cup-shaped member, said fitting comprising a surface for contacting and supporting the undersurface of said board; and
- a slot which extends across said surface from an outside edge of said surface to said bore for providing a second vacuum passageway between the interior of said cup-shaped fitting and said bore when said board is supported on said surface.

19. An apparatus according to claim 18 comprising a third vacuum passageway having an opening in said first cavity exterior of said cup-shaped member for providing a vacuum in that portion of said cavity outside of said cup-shaped member when said board is resting on said cup-shaped member.

* * * * *